United States Patent
Aiello et al.

[19]

[11] Patent Number: 5,804,866
[45] Date of Patent: Sep. 8, 1998

[54] METHOD AND DEVICE FOR DYNAMICALLY SELF-BIASING REGIONS OF INTEGRATED CIRCUITS

[75] Inventors: Natale Aiello, Catania; Vito Graziano, Palermo, both of Italy

[73] Assignee: Consorzio per la Ricerca sulla Microelettronica nel Mezzogiorno, Catania, Italy

[21] Appl. No.: 619,421

[22] Filed: Mar. 21, 1996

[30]     Foreign Application Priority Data

Mar. 22, 1995 [EP]   European Pat. Off. .............. 95830109

[51] Int. Cl.⁶ ...................... H01L 27/082; H01L 27/102; H01L 29/70
[52] U.S. Cl. ........................... 257/577; 257/566; 327/53; 327/54; 327/56; 327/77
[58] Field of Search .................................... 257/566, 577; 327/51, 52, 53, 54, 56, 72, 77

[56]           References Cited

U.S. PATENT DOCUMENTS 5,065,055  11/1991  Reed .......................................... 327/53
5,159,207  10/1992  Pavlin et al. .......................... 307/296.2

OTHER PUBLICATIONS

Patents Abstracts of Japan, vol. 013, No. 522 (E–849), Nov. 21, 1989 & JP–A–01 212463 (Mitsubishi Electric Corp.).

Primary Examiner—Ngân V. Ngô
Attorney, Agent, or Firm—Wolf, Greefield & Sacks, P.C.

[57]           ABSTRACT

A method and device for maintaining junction isolation between a second region that is normally clamped at a reference potential, contained within a first region of an opposite type of conductivity whose potential is subject to large inertial swings. The junction is ensured even when the potential of the first region moves toward and beyond the reference potential to which the second region is clamped, by connecting the second region to the reference potential by a switch, and causing the switch to open which places the second region in a floating state, leaving it free to track the potential excursion of the first region. The switch is closed after the potential of the first region has returned to a normal value. A comparator senses a shift of the potential of the second region from the reference potential to which it is clamped. The shift is dynamically induced by the capacitive coupling of the two regions, and triggers off the clamping switch.

18 Claims, 5 Drawing Sheets

METHOD AND DEVICE FOR DYNAMICALLY SELF-BIASING REGIONS OF INTEGRATED CIRCUITS

BACKGROUND OF THE INVENTION

1. Field of the Invention

The present invention relates to a switching method for self-biasing regions of integrated circuits in order to ensure the maintenance of an effective junction isolation between two different regions coupled with each other when one of the two regions is subject to large voltage swings. The present invention also relates to a wholly integratable device implementing the method. The invention is particularly, though not exclusively, useful in integrated circuits that include power circuits and control circuits integrated on the same chip.

2. Discussion of the Related Art

In integrated circuits (IC), output power devices and logic control circuits are often integrated on the same chip. The kinds of applications possible are innumerable. For example, an IC implementing a so-called "electronic transformer" for driving low-power halogen lamps, driving systems for displays, electric motors, actuators and the like are all possible.

An integrated power device, for example, a bipolar transistor, a Darlington structure, or an equivalent power MOS, has an external reactive load connected to the collector (or drain) node thereof. When the control circuitry switches off the power device, the collector's (or drain's) voltage may assume a negative value (below ground potential). These induced voltages may be extremely dangerous when the power device is integrated together with control circuits on the same chip.

A family of these types of devices is commonly known by the commercial name of VIPower. In these devices, as schematically shown in FIG. 1, the current terminal of an output power device, for example the collector of an NPN transistor, coincides with the substrate (region 1), commonly an N-type semiconductor, of the IC. The logic control circuitry is integrated within an isolation region (region 2) commonly a P-type diffusion (e.g. a P-well), diffused in the substrate region 1.

Isolation between the substrate-collector (region 1) and the isolation region (region 2) is ensured by the reverse bias of the P-N junction between the two regions.

Under normal working conditions of the IC, the isolation region (P-well) containing control circuitry, is customarily connected to a certain reference voltage, which in a case as the one depicted in FIG. 1, may be the lowest potential available. In practice, this is the ground potential. In this type of architecture, during operation, the N-type substrate region which coincides with the output current terminal of the power device, in the example shown the collector of an NPN power transistor, is always at a positive voltage as referred to ground potential. Therefore, the intrinsic parasitic transistors of the integrated structure are inhibited.

If, for any reason, for example following the switching off of the power device, the N-type substrate region assumes a negative voltage (below-ground) of a negative value greater than the conduction threshold, the parasitic transistors of the integrated structure turn on and absorb current from the region containing the control circuitry. This may cause malfunctioning of the control circuits, as well as of the controlled power devices.

These risks could be easily eliminated by biasing the P-type isolation region (P-well) at a potential sufficiently below the maximum negative voltage that may be reached by the N-type substrate region. However, negative bias voltage sources are not normally available and would need to be purposely implemented in the IC.

For simplicity of description, in the ensuing description reference will be made almost exclusively to the sample case of an integrated architecture of the type depicted in FIG. 1, based on a P-type isolation region, diffused in an N-type substrate. However it should be understood that similar considerations may be made for a "dual" situation of an architecture using inverted conductivity types and polarities. Moreover, it will be clear to the reader that the technical problems addressed by the present invention may be encountered in a variety of other types of integrated circuits.

In the past, there have been several proposals for preventing the occurrence of a direct biasing of the junction between two regions coupled together.

French Patent Application No. 89/16144, filed on Nov. 29, 1989, in the name of SGS-THOMSON MICROELECTRONICS and SIEMENS AUTOMOTIVE and U.S. Pat. No. 5,382,837, corresponding to the European patent application No. 91850287.8, filed on Jun. 27, 1991, by the same applicant of the present application, describe circuit arrangements for ensuring junction isolation between two regions.

Both of these known proposed solutions propose to clamp a P-type isolation region to ground potential through a first switch as long as an N-type substrate region remains at a positive voltage and to connect the isolation region to the substrate region by a second switch when the latter region assumes a negative (below-ground) potential.

These known solutions, beside requiring the use of two switches, have critical aspects and drawbacks. A first disadvantage is represented by the need of ensuring with absolute reliability that the two switches may never be conductive simultaneously, because this would short-circuit the substrate region to ground. A second difficulty is in ensuring a timely biasing of the isolation region at the substrate potential when the substrate's voltage drops abruptly toward a negative (below-ground) potential.

SUMMARY OF THE INVENTION

Therefore there is a need and/or utility for a simpler and more reliable switching or self biasing method and a device capable of ensuring a timely response in case of abrupt voltage changes of a first region, for example a substrate region, toward the voltage at which is normally biased a second region, for example an isolation region, in order to prevent any possibility of direct biasing the junction between the two regions.

These objectives are fully met by the method and the device of the present invention.

The method of the invention is based on maintaining the second region clamped at an available reference potential by a switch, and then commanding the opening of the switch, thus placing the region in a high impedance condition as compared to the node at said reference voltage to which is normally connected through the switch. The opening of the switch occurs automatically in response to a variation toward the reference potential of the voltage of the first region at a gradient sufficient to cause, by a capacitive dynamic voltage distribution, a momentary shift in the same direction of the voltage of the second region.

In other words, the method implies the interruption of the connection of the second region to the clamp voltage node, thus allowing the second region to float and track, by virtue of its capacitive coupling, the voltage swing of the first region, which is subject to abrupt voltage changes toward the clamp voltage.

When an abrupt voltage variation of the first region occurs towards the reference potential to which the second region is clamped, the second region is momentarily subject to a voltage shift from the clamping reference voltage of the node to which it is connected through the switch in the same direction of the variation (dV/dt) of the voltage of the first region through capacitive coupling and a resulting dynamic voltage distribution. Thus the second region assumes momentarily a potential lower voltage (or greater in a dual situation with inverted polarities) than the reference voltage to which it is clamped. This momentary shift eventually causes the opening of the switch and thus permits the potential of the second region to continue to track (in a floating state) the voltage change (dV/dt) of the first region by virtue of the capacitive coupling existing therebetween, thus making impossible the occurrence of a direct biasing of the junction between the two regions.

Of course, the system is capable of reacting in the above-described manner, only in the presence of a gradient of variation of the voltage of the first region (dV/dt) of a sufficient magnitude. On the other hand, in systems operating in a switching mode, the changes of state are typically step-functions (that is extremely abrupt) and therefore the magnitude of the gradient of the voltage variation is generally sufficient.

In practice, the dynamic self-biasing switching device of the invention may consist of a single integrated switch capable of establishing a connection of the second region with a node at a reference voltage and a controlling comparator.

BRIEF DESCRIPTION OF THE DRAWINGS

The different aspects and advantages of the invention will become even more evident through the following description of several important embodiments, included herein for purely illustrative non limitative purposes, and by referring to the drawings, wherein.

DETAILED DESCRIPTION

Figure 1:
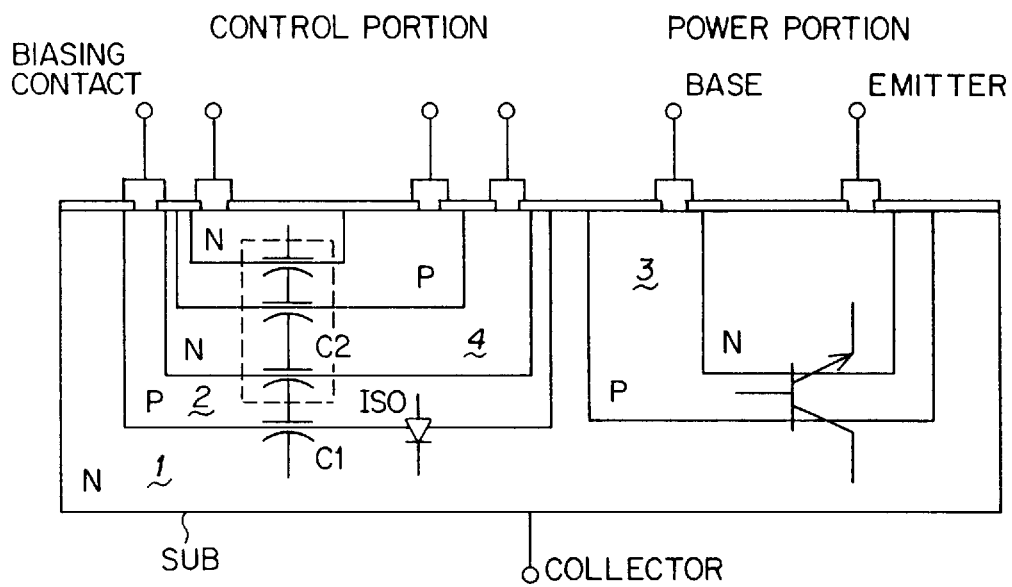
FIG. 1 shows the architecture of an integrated circuit for single supply wherein the above-identified technical problems may be encountered.

A common architecture of an integrated circuit comprising a power section and a control section is schematically depicted in FIG. 1. In the example shown, the power section is represented by a bipolar NPN power transistor having a vertical current flow, the collector of which coincides with an N-type substrate region 1 of the integrated circuit.

The control portion, typically logic circuitry, is realized within a P-type isolation region 2 (P-well) diffused in the N-type substrate. FIG. 1 symbolically shows the junction capacitance C1 between the substrate 1 and the isolation region 2. Also shown is the other structural capacitances of the integrated architecture of the control circuitry, toward a common ground node, indicated as a whole with C2, as well as the NPN power transistor and the junction (diode) between the substrate 1 and the isolation region 2.

Figure 2:
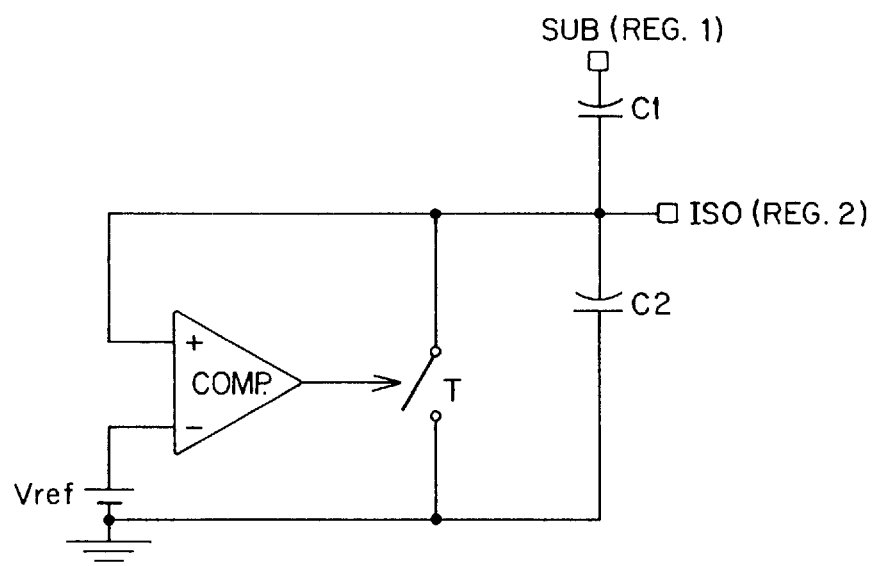
FIG. 2 is a diagram of the device of the invention.

For an application of the type schematically represented in FIG. 1, the basic diagram of the device of the invention is shown in FIG. 2.

The capacitance C1 represents the junction capacitance between the N-type substrate 1 (SUB) and the P-type isolation diffusion 2 (ISO). The capacitance C2 represents the series of capacitances, relative to the junctions between regions of 9 different type of conductivity, that make up the integrated structures of the components of the control circuitry contained in the isolation region 2.

In the examples of FIGS. 1 and 2, the substrate 1 constitutes the collector of an NPN power transistor. During normal operation, the substrate-collector 1 (SUB) of the integrated circuit is at a positive voltage as compared to a common ground potential of the circuit. The emitter of the same NPN power transistor as well as the emitter of a generic NPN transistor of the control section of the integrated circuit may be coupled to a common ground potential of the circuit, as depicted in FIGS. 1 and 2.

During the normal operation of the circuit in FIG. 2, the isolation p-well region 2 (ISO) is connected, through a switch T, to the ground node of the circuit.

As long as the potential of the region 2 coincides with the ground potential, the comparator COMP maintains the switch T closed.

When for any reason, as for example because of the switching off of the output power transistor in the presence of an inductive external load, the potential of the region 1 (SUB) drops abruptly toward ground potential (being steadily dragged inertially toward negative voltage values), by capacitive coupling, the potential of the isolation region 2 (ISO) is also momentarily dragged toward negative (below-ground) voltage values. Any dynamic potential shifting, towards a negative voltage as in the example, of the isolation region 2 beyond the reference voltage (ground potential) to which it is clamped by the switch T, is detected by the comparator COMP which changes state, thus opening the switch T.

The opening of the switch T places the isolation region 2 (ISO) in a floating or high impedance condition with reference to the ground node so that the region potential is free to track the falling voltage of the substrate region 1. It assumes more and more negative voltage values, because of its capacitive coupling through C1 and C2. This dynamic potential tracking mechanism ensures that the isolation region 2 (ISO) always remains at a lower negative potential than the potential assumed by the substrate region 1 (SUB).

The negative voltage value (V2) eventually reached by the isolation region 2, following a negative variation (negative dV/dt) of the voltage V1 of the substrate region 1, is tied to the relative values of the coupling capacitances C1 and C2 and to the value of an eventual leakage current. By neglecting any leakage current, the following relationship holds:

$$V2 = -\frac{C1}{C1 + C2} V1$$

On the other hand, the period of time during which the isolation region 2 remains at a negative voltage V2, dynamically reached because of its capacitive coupling, is tied to the leakage current as well as to the actual values of the coupling capacitances C1 and C2. By supposing a leakage current i of a constant value, such a period of time may be calculated with the following equation:

$$T = \frac{V_2}{i}(C1 + C2)$$

Of course, such a period of time T must be sufficiently longer than the maximum interval of time during which the substrate region 1 may assume a negative (below-ground) voltage. Such a maximum period of time may be easily established in the design stage by knowing the electrical characteristics of the external load.

It may be easily verified that, in the majority of cases, the levels of leakage current are sufficiently low so as to make the junction capacitances C1 and C2 of the region 2 quite appropriate for the purpose intended. The need of increasing the values of the coupling capacitances, by eventually integrating parallel capacitances, could present itself only in case the level of leakage currents would be so high as to make the "hold" time T too short.

In practice, in the majority of cases, the device of the invention will not require any externally connected additional components (for example capacitors to be connected in parallel to the intrinsic junction capacitances C1 and C2 of the integrated structure).

As soon as the potential of the region 2 (ISO) rises back toward a positive voltage, and equals the threshold voltage $V_{ref}$, which may be predefined so as to be lower than the conduction threshold of the junction between the regions 1 and 2, the comparator (COMP) switches, thus closing the switch T and re-establishing the clamping to ground potential of the region 2.

Figure 3:
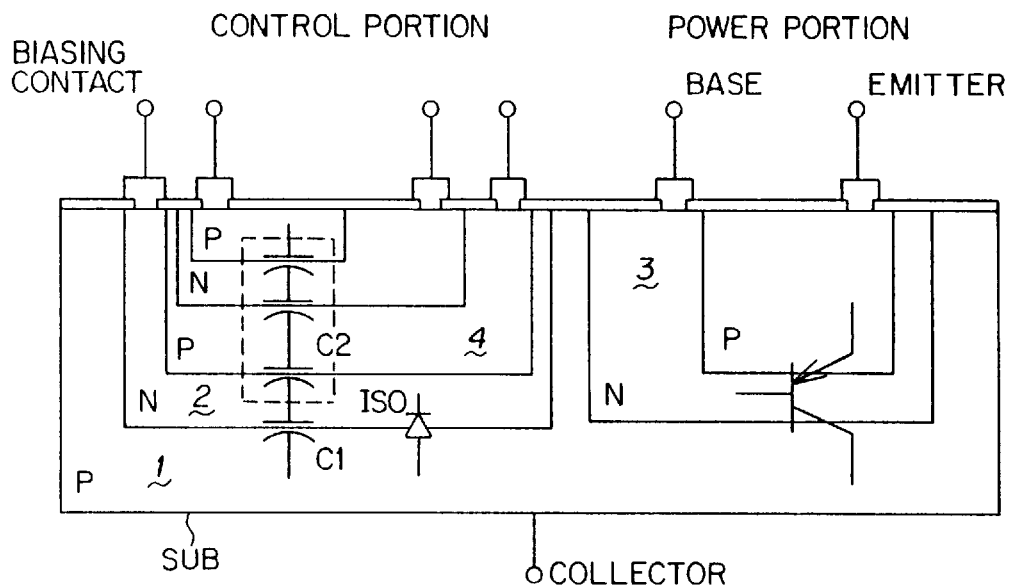
FIGS. 3 and 4 show a dual situation of the one depicted in FIGS. 1 and 2.
Figure 4:
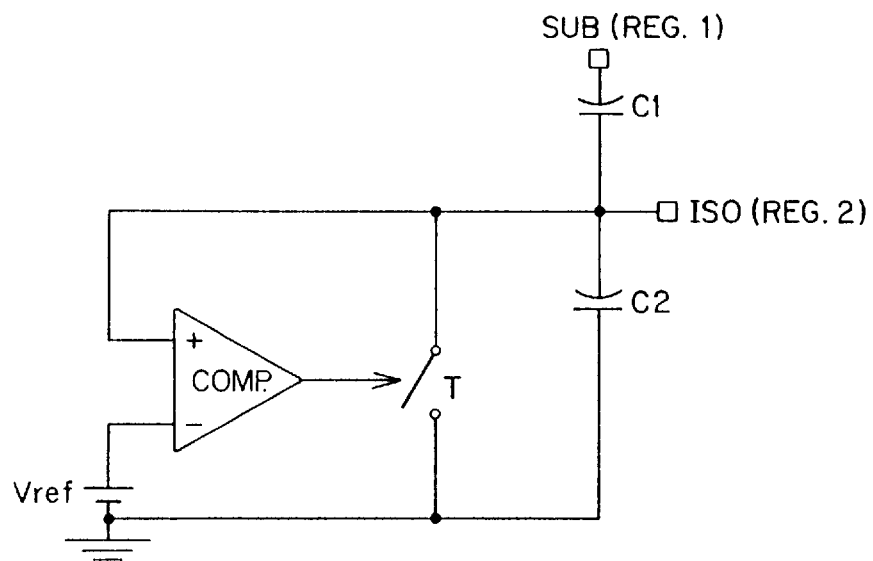

FIGS. 3 and 4 show an application of the device of the invention in the case of an equivalent "dual" architecture of the integrated circuit, that is, wherein the type of conductivities and polarities are all reversed. Of course, in such an alternative embodiment, the logic of the comparator COMP will also be inverted so as to perform the opening of the switch T following a positive dV/dt variation of the voltage of the substrate region 1 (which is normally negative).

Figure 5:
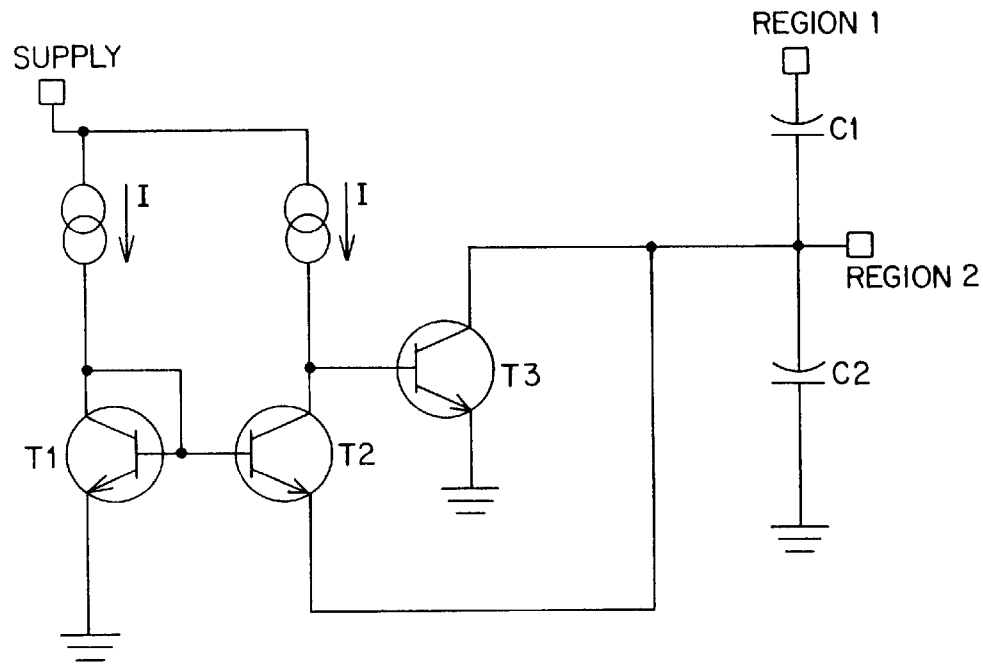
FIG. 5 is a basic circuit diagram of an embodiment of the invention.

For the case of FIGS. 1 and 2, the basic electric circuit arrangement of the invention may be as shown in FIG. 5. In FIG. 5, the current generator I and the transistors T1 and T2, form an error amplifier, the voltage reference of which is connected to ground potential, while the switch (T in the scheme of FIG. 2) is implemented by the transistor T3.

Upon a negative dV/dt variation on the node of region 1, the node of region 2 assumes a potential that, in first approximation, is given by the equation (1), thus causing the saturation of the transistor T2 and therefore the turning off of the switch T3. In this way, the node coinciding with the region 2 acquires an extremely high impedance. At the end of a period of time T given, in first approximation, by the equation (2) or upon a positive dV/dt variation of the voltage of the region 1, the potential of the region 2 rises again toward ground potential.

When it reaches ground potential, the transistor T2 exits saturation thus switching on again the switch T3 which re-establishes a connection of the region 2 to the ground node.

Figure 6:
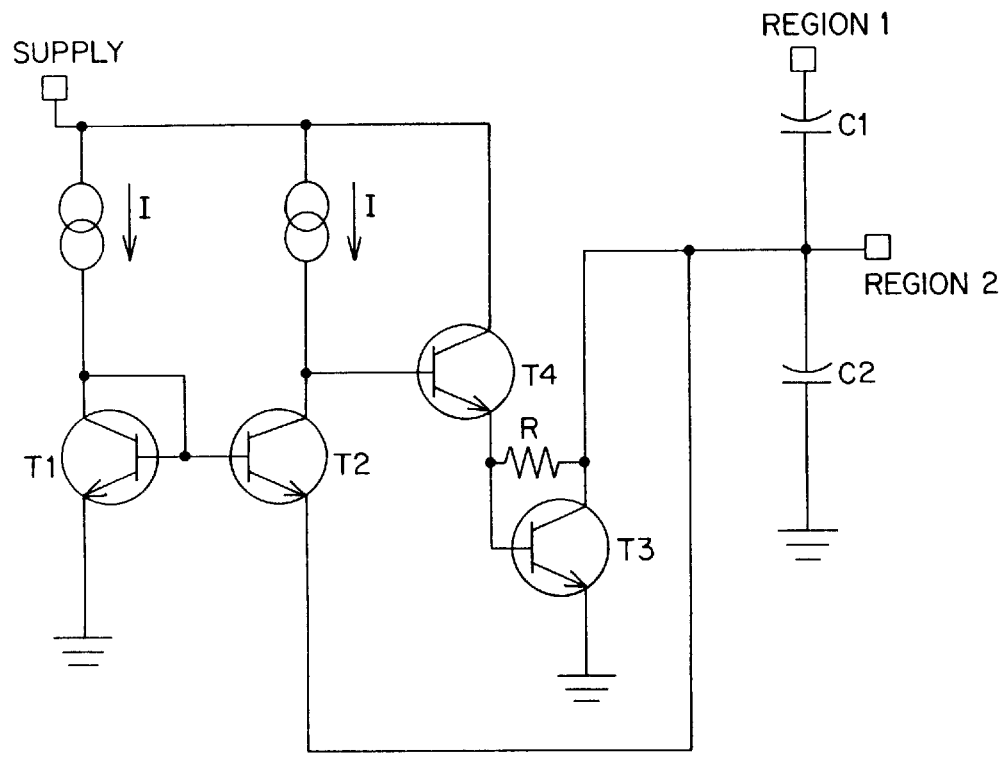
FIG. 6 is a basic circuit diagram according to an alternative embodiment of the invention.

In order to avoid overloading the output of the comparator and therefore obtaining an improved switching performance, the circuit of FIG. 5 may be advantageously modified as shown in FIG. 6.

By adding a stage formed by the transistor T4, the current absorption from the comparator is reduced by a number of times equivalent to the current gain of the stage T4 and, by virtue of the resistance R, the time necessary to effectively clamp the region 2 to ground potential may be considerably reduced because the transistor T3 is already biased when the potential of the region 2 tends to rise above ground potential (that is, starts to be driven toward a positive voltage).

Figure 7:
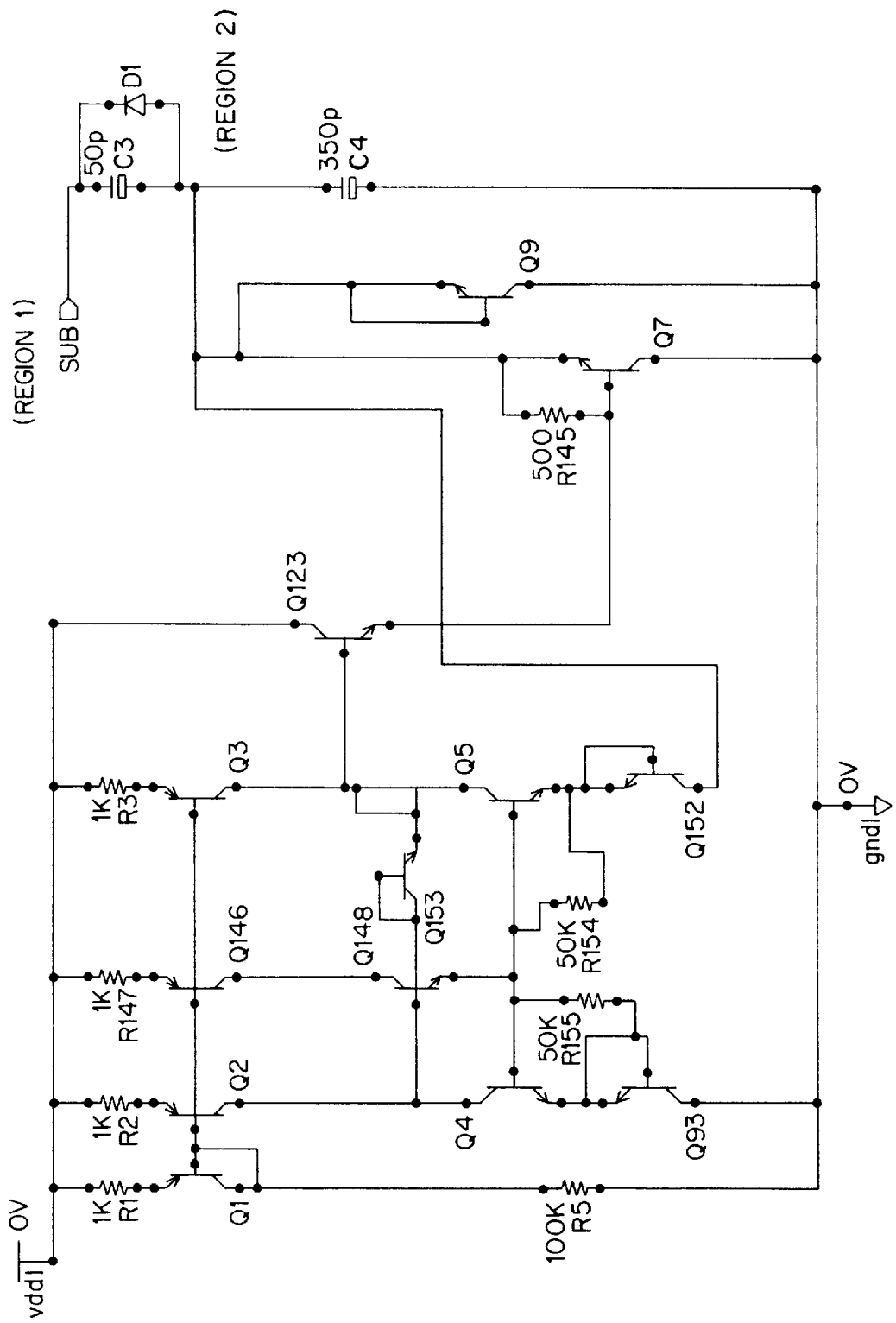
FIG. 7 is a complete circuit diagram of a device of the invention.

A complete circuit scheme of a device of the invention is depicted in FIG. 7.

As can be noted from the scheme, an error amplifier with emitter input and an output stage for driving the isolation region (2) node may be easily identified.

Two diodes, namely: Q93 and Q152, have been added in the circuit of the error amplifier in series with the emitters of the input transistors Q4 and Q5 in order to increase the maximum absolute voltage value that may be reached by the isolation region 2. The resistors R154 and R155 in parallel to the base emitter junctions of the input pair of transistors Q4 and Q5 have the function of reducing the storage time thereof.

Finally, the static biasing of Q5 has the function of preventing an excessively deep saturation thereof when conducting.

Figure 8:
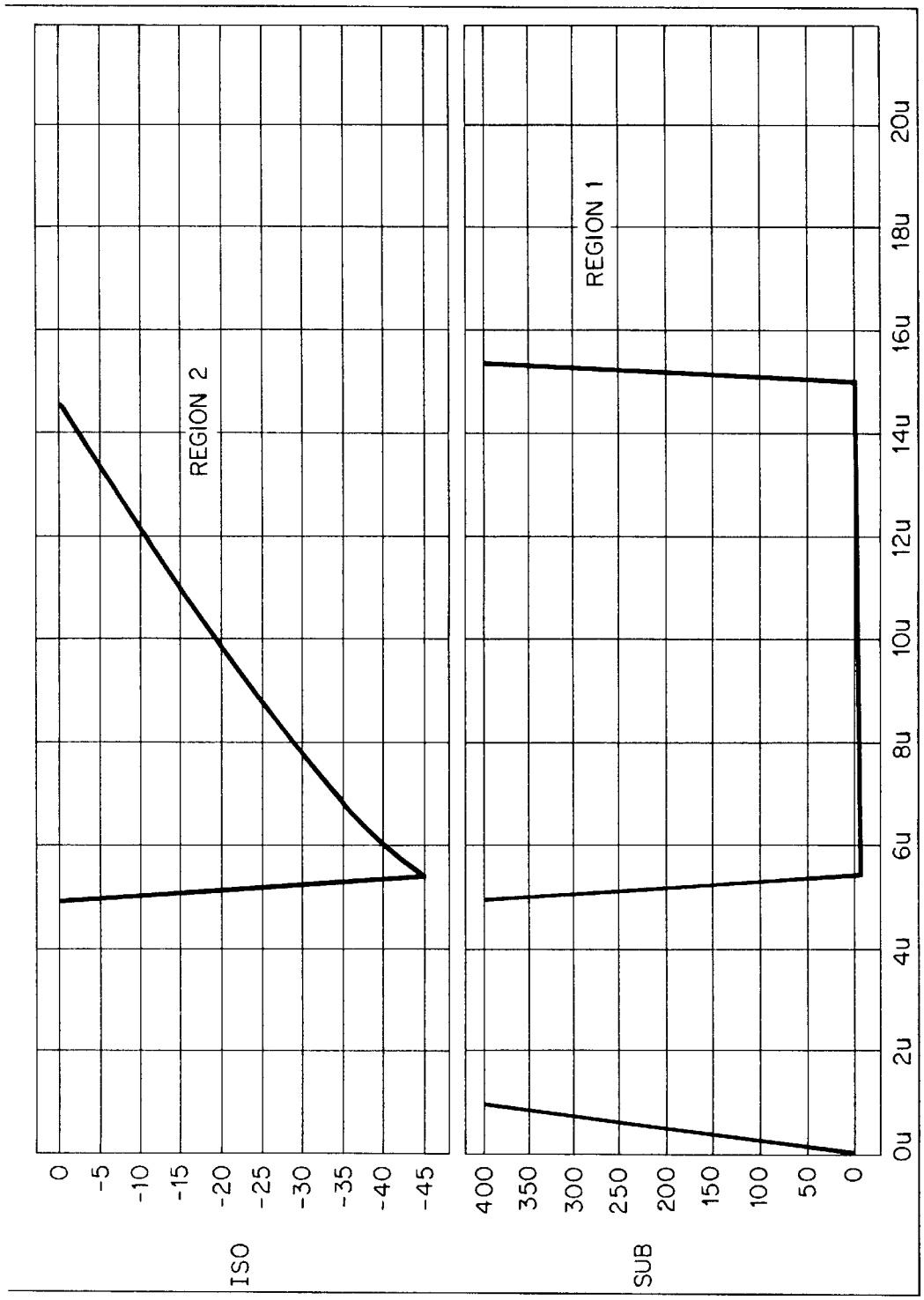
FIG. 8 shows circuit's voltage signals obtained by simulation.

Voltage diagrams of the node coinciding with a substrate region 1, and of the node coinciding with an isolation region 2, obtained by simulating the use of a switching circuit as the one depicted in FIG. 7 are shown in FIG. 8.

The simulations have fully confirmed the effectiveness of the device of the invention. From the simulations, it has been found that the maximum operative voltage of the node coinciding with the region 1 (substrate-collector), and therefore the range of application of the device of the invention, is a function of three variables. First it is a function of the amplitude the gradient dV/dt, to which the same region 1 may be subjected to. Second, it is related to the capacitive voltage distribution that may be altered in the design stage by realizing capacitances in parallel to the intrinsic junction capacitances C1 and C2 (or by eventually connecting external capacitors). Finally, it is related to the open circuit collector emitter breakdown voltage (BVceo) of the integrated components. This last parameter will in fact determine the maximum value (modulus) that may be reached by the voltage of region 2.

According to common fabrication processes for these types of devices, the BVceo of integrated transistors is of about 60 V. Should the voltage of the region 2 reach the breakdown voltage of the components, a breakdown phenomenon would be triggered. Such a phenomenon, by injection of current from the ground node toward the region 2 according to equation (2), would reduce the time T and increase the risk of failing to ensure a junction isolation between the regions 1 and 2. Of course, other parameters that may critically affect the switching process of the invention may be suitably chosen in the design stage by taking into account the above-mentioned limits.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A device for dynamically biasing a second region of a first type of conductivity of an integrated circuit which is normally biased at a reference voltage and is contained in a first region of a second type of conductivity, which constitutes an output current node of at least one power device, comprising:

an integrated switch connecting said second region to said reference voltage;

a comparator connected to said switch, for opening said switch, thus placing said second region in a high impedance condition as compared to said reference voltage, wherein said switch opening occur, in response to a variation toward said reference voltage of the voltage of said first region of sufficient amount to cause, by dynamic capacitive voltage distribution, a shift in the same direction of the potential of said second region from said reference voltage.

2. The device according to claim 1, wherein the change of state of said comparator occurs upon the crossing in a direction or in the opposite direction of a threshold voltage connected to said comparator as compared with said reference voltage.

3. The device according to claim 1, wherein said first region is an N-type substrate region and said second region is an isolation P-type region, diffused in said substrate region and said switch is opened by said comparator upon a variation of the voltage of said first substrate region from a positive value toward a negative (below-ground) value.

4. An integrated circuit comprising:

a first semiconductor region of a first conductivity type;

a second semiconductor region of a second conductivity type disposed within said first region switching means for connecting and disconnecting a reference potential to said second region; and a controlling means for controlling said switching means in response to variations of a potential of said second region.

5. The integrated circuit according to claim 4, wherein said controlling means includes means for causing said switching means to disconnect said reference potential from said second region, when a potential of said second region varies from the reference potential.

6. The integrated circuit according to claim 5, wherein said controlling means includes means for causing said switching means to connect said reference potential to said second region, when a potential of said second region is substantially equivalent to the reference potential.

7. The integrated circuit according to claim 5, wherein said controlling means includes means for causing said switching means to connect said reference potential to said second region, after a predetermined time has elapsed after disconnection of said reference potential and said second region.

8. The integrated circuit according to claim 5, wherein a variation in said potential of said second region is caused by a dynamic capacitive voltage distribution between said first and second regions.

9. The integrated circuit according to claim 7, wherein said predetermined time is greater than a maximum time that a potential difference between a potential of said first region and the reference potential changes sign.

10. The integrated circuit according to claim 4, wherein:

said switching means comprises a switch between said reference potential and said second region, and said controlling means comprises a comparator comparing a potential of said second region with the reference potential, said comparator being coupled to activate said switch.

11. The integrated circuit according to claim 4 wherein said switching means includes at least one transistor connected between said reference potential and said second region, and said controlling means includes an error amplifier having a voltage reference connected to the reference potential and a connection to said base of said at least one transistor so as to control said at least one transistor.

12. The integrated circuit according to claim 4 wherein said first region is an N-type substrate region, and said second region is a P-type isolation region.

13. The apparatus according to claim 4 wherein said second region is an N-type isolation region, and said first region is a P-type substrate region.

14. The integrated circuit according to claim 4, further comprising:

logic circuitry disposed within, and isolated by, said second region.

15. The apparatus according to claim 14, wherein said first region is an output current terminal of an integrated vertical type power device.

16. A bias adjusting switch comprising:

a detecting means for detecting voltage fluctuation in a semiconductor region, when said semiconductor region is connected to a reference voltage, and a disconnecting means to disconnect said semiconductor region from said reference voltage when a voltage fluctuation in said semiconductor region is detected by said detecting means.

17. The bias adjusting switch according to claim 16, wherein said variation in voltage of said semiconductor region occurs via a capacitive junction between said semiconductor region and another semiconductor region.

18. The bias adjusting switch according to claim 17, wherein said disconnecting means includes at least one transistor connected between said semiconductor region and said reference voltage, and said detecting means includes at least one transistor connected in such a way so as to detect said voltage fluctuation.

* * * * *